(12) United States Patent
You et al.

(10) Patent No.: US 11,380,635 B2
(45) Date of Patent: Jul. 5, 2022

(54) SEMICONDUCTOR DEVICE

(71) Applicant: Samsung Electronics Co., Ltd., Suwon-si (KR)

(72) Inventors: Se-Ho You, Seoul (KR); Seongho Shin, Hwaseong-si (KR); Bangweon Lee, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 15 days.

(21) Appl. No.: 17/121,898

(22) Filed: Dec. 15, 2020

(65) Prior Publication Data

US 2021/0335734 A1 Oct. 28, 2021

(30) Foreign Application Priority Data

Apr. 23, 2020 (KR) .................. 10-2020-0049074

(51) Int. Cl.
*H01L 23/66* (2006.01)
*H01L 23/00* (2006.01)

(52) U.S. Cl.
CPC .............. *H01L 23/66* (2013.01); *H01L 24/20* (2013.01); *H01L 2223/6616* (2013.01); *H01L 2223/6677* (2013.01); *H01L 2924/1421* (2013.01)

(58) Field of Classification Search
CPC ..... H01L 23/66; H01L 23/5389; H01L 23/28; H01L 23/485; H01L 24/20; H01L 2223/6616; H01L 2223/6677; H01L 2924/1421
USPC ........................................................ 257/728
See application file for complete search history.

(56) References Cited

U.S. PATENT DOCUMENTS

| | | | |
|---|---|---|---|
| 9,799,954 B2 | 10/2017 | Preradovic et al. | |
| 10,103,088 B1 | 10/2018 | Qi et al. | |
| 10,170,838 B2 | 1/2019 | Garcia et al. | |
| 10,236,264 B2 | 3/2019 | Ikeda et al. | |
| 10,490,879 B2 | 11/2019 | Baek et al. | |
| 11,005,155 B2 * | 5/2021 | Khan | H01L 23/49822 |
| 11,165,143 B2 * | 11/2021 | Kim | H01L 23/49822 |
| 2019/0101636 A1 | 4/2019 | Trotta et al. | |
| 2019/0140343 A1 * | 5/2019 | Choudhury | H01Q 9/0407 |
| 2019/0319347 A1 | 10/2019 | Fang et al. | |
| 2019/0393172 A1 | 12/2019 | Pietambaram et al. | |
| 2020/0411996 A1 * | 12/2020 | Wang | H01Q 1/2283 |
| 2021/0036405 A1 * | 2/2021 | Han | H01L 23/66 |
| 2021/0328367 A1 * | 10/2021 | Tang | H01Q 1/2283 |

FOREIGN PATENT DOCUMENTS

KR 10-0836537 B1 6/2008

\* cited by examiner

*Primary Examiner* — Dao H Nguyen
(74) *Attorney, Agent, or Firm* — Muir Patent Law, PLLC (57) ABSTRACT

A semiconductor device may include a substrate, a first semiconductor chip buried in the substrate, a first antenna pattern, a second antenna pattern, and outer terminals. A bottom surface of the substrate may include first and second regions spaced apart from each other. The first semiconductor chip may have a first active surface that is directed to the top surface of a core portion of the substrate. The first antenna pattern may be provided on the top surface of the substrate and electrically connected to the first semiconductor chip. The outer terminals may be provided on the first region of the bottom surface of the substrate, and the second antenna pattern may be provided on the second region of the bottom surface of the substrate.

20 Claims, 10 Drawing Sheets

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2020-0049074, filed on Apr. 23, 2020, in the Korean Intellectual Property Office, the entire contents of which are hereby incorporated by reference.

BACKGROUND OF THE INVENTION

The present disclosure relates to a semiconductor device, and in particular, to a semiconductor device including an antenna.

To meet a recent increasing demand for high performance electronic devices, it is necessary to increase a frequency and a bandwidth of an electromagnetic wave to be used for various components in mobile devices, such as smart phones. In particular, for mm-wave and 5G antenna modules, it is necessary not only to reduce a size of the module but also to minimize interference between parts in the antenna module. Furthermore, to secure a degree of freedom in mounting position in a set, there are many restrictions on geometrical features (e.g., size, thickness, or the like) of the module.

SUMMARY

An embodiment of the inventive concept provides a semiconductor device including antenna patterns, which are configured to reduce a shadow region and to increase signal radiation efficiency.

An embodiment of the inventive concept provides a semiconductor device with a reduced size.

An embodiment of the inventive concept provides a semiconductor device with improved electric characteristics.

According to an embodiment of the inventive concept, a semiconductor device may include a substrate, a bottom surface of the substrate including first and second regions spaced apart from each other, a first semiconductor chip buried in the substrate, the first semiconductor chip having a first active surface that is directed to a top surface of a core portion of the substrate, a first antenna pattern provided on the top surface of the substrate and electrically connected to the first semiconductor chip, a second antenna pattern provided on the first region of the bottom surface of the substrate, and outer terminals provided on the second region of the bottom surface of the substrate.

According to an embodiment of the inventive concept, a semiconductor device may include a core portion having a first surface and a second surface, which are opposite to each other, a first buildup portion and a second buildup portion provided on the first surface and the second surface, respectively, each of the first and second buildup portions including a plurality of insulating layers and a plurality of interconnection layers, which are sequentially stacked, a first semiconductor chip, which is provided in a first mounting region formed by partially removing the core portion and is electrically connected to the first buildup portion, a first antenna pattern provided on a surface of the first buildup portion, a second antenna pattern provided on a surface of the second buildup portion, and outer terminals provided on the surface of the second buildup portion. The second antenna pattern may be provided on a first region of the second buildup portion. The outer terminals may be provided on a second region of the second buildup portion, which is different from the first region.

According to an embodiment of the inventive concept, a semiconductor device may include a first redistribution substrate, a first semiconductor chip having a first active surface in contact with a top surface of the first redistribution substrate, a second redistribution substrate disposed on the first redistribution substrate to cover the first semiconductor chip, vertical connection terminals provided at a side of the first semiconductor chip to vertically connect the first and second redistribution substrates to each other, a first antenna pattern, which is provided on a top surface of the second redistribution substrate and is electrically connected to the first semiconductor chip through the second redistribution substrate, a second antenna pattern provided on a first region of a bottom surface of the first redistribution substrate, and an outer terminal provided on a second region of the bottom surface of the first redistribution substrate, the first and second regions being spaced apart from each other.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Example embodiments of the inventive concepts will now be described more fully with reference to the accompanying drawings, in which example embodiments are shown.

Figure 1:
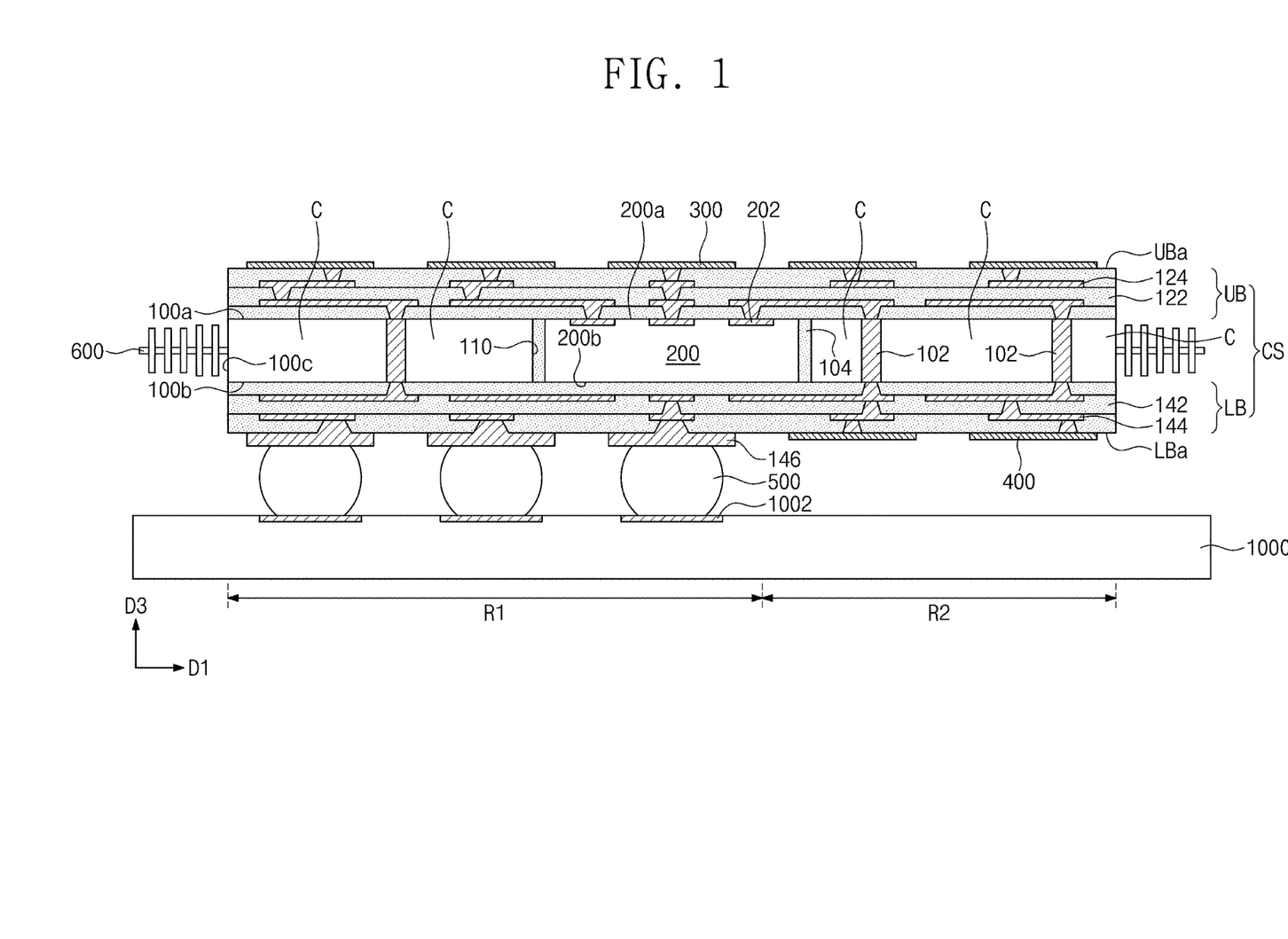
FIG. 1 is a sectional view illustrating a semiconductor device according to an embodiment of the inventive concept.
Figure 2:
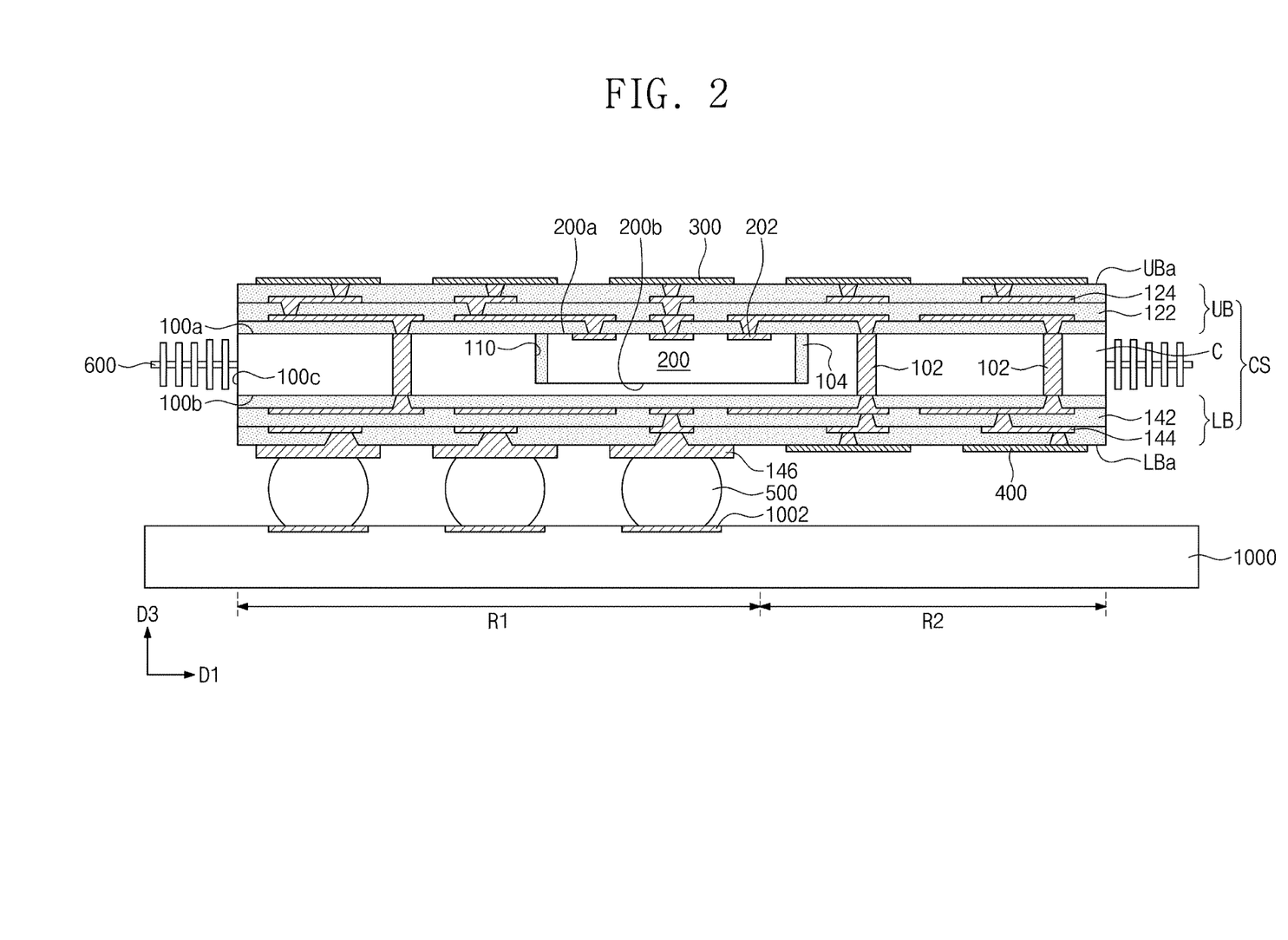
FIG. 2 is a sectional view illustrating a semiconductor device according to an embodiment of the inventive concept.
Figure 3:
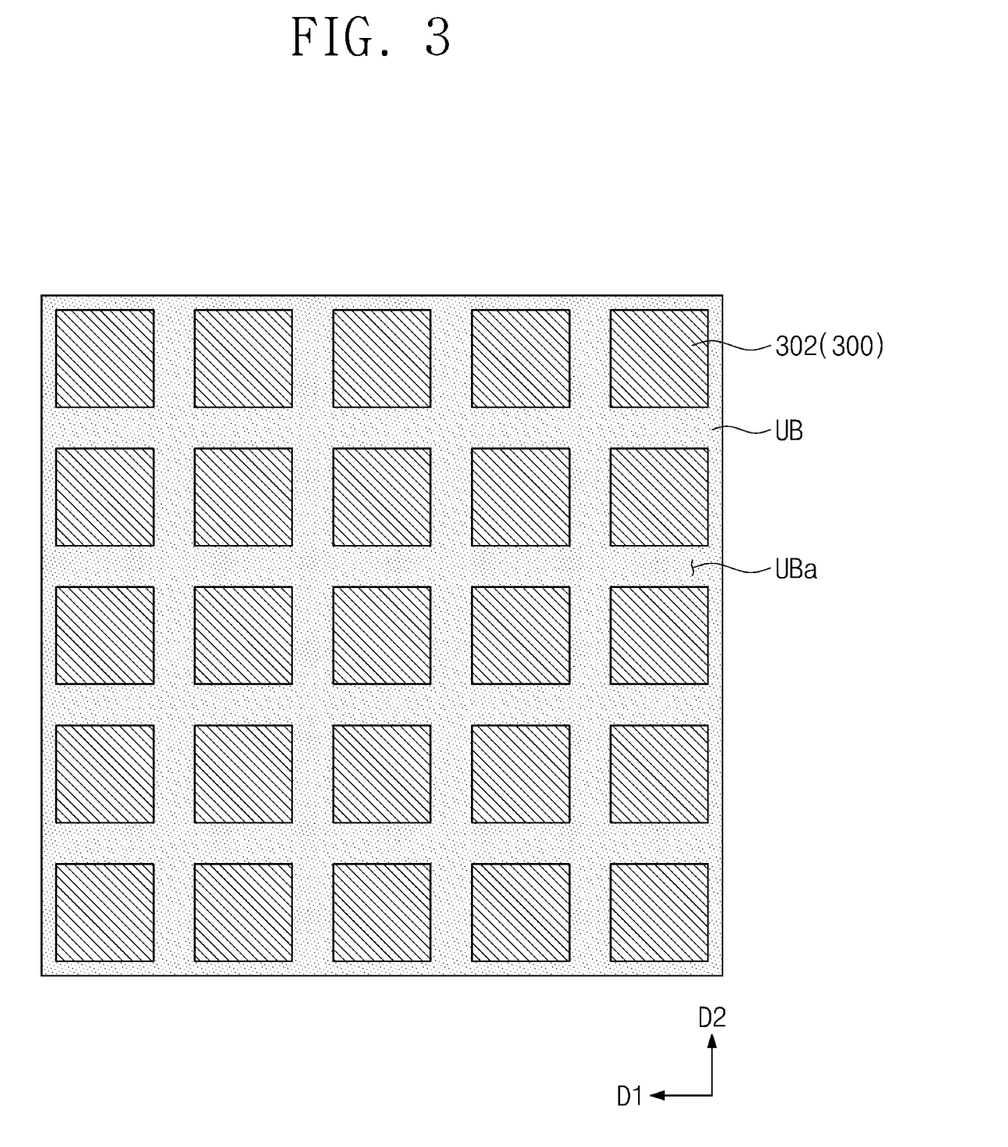
FIGS. 3 and 4 are plan views illustrating a semiconductor device according to an embodiment of the inventive concept.
Figure 4:
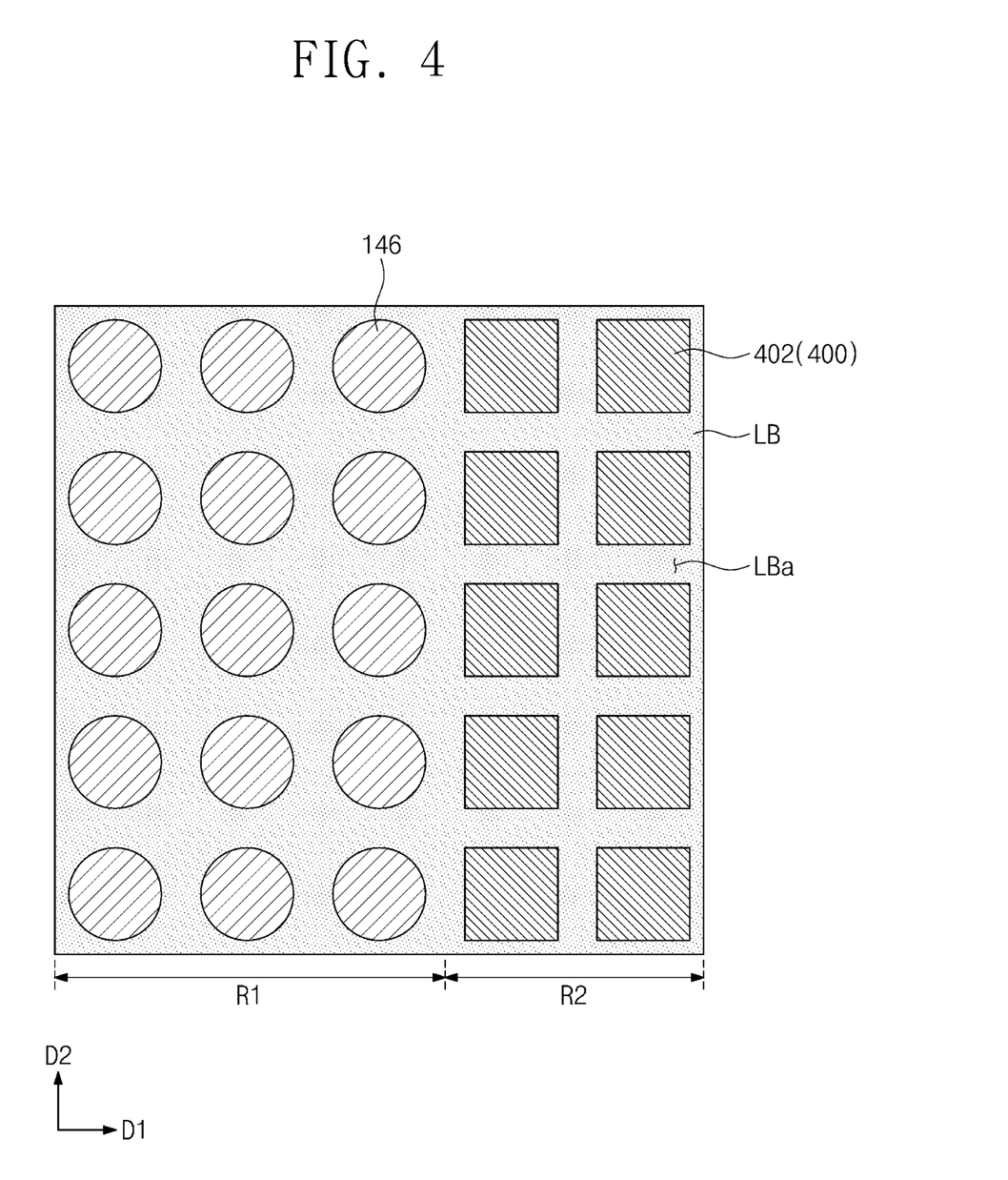

FIG. 1 is a sectional view illustrating a semiconductor device according to an embodiment of the inventive concept. FIG. 2 is a sectional view illustrating a semiconductor device according to an embodiment of the inventive concept. FIGS. 3 and 4 are plan views illustrating a semiconductor device according to an embodiment of the inventive concept. For example, FIG. 3 is a top plan view illustrating the semiconductor device of FIG. 1, and FIG. 4 is a bottom plan view illustrating the semiconductor device of FIG. 1.

Referring to FIG. 1, a semiconductor device may include an interconnection substrate CS, a first semiconductor chip 200, a first antenna pattern 300, and a second antenna pattern 400.

The interconnection substrate CS may include a core portion C, an upper buildup portion UB, which is disposed on a top surface of the core portion C, and a lower buildup portion LB, which is disposed on a bottom surface of the core portion C.

The core portion C may extend in a specific direction (e.g., extend horizontally). The core portion C may be in the form of a core pattern, which is formed from removing a portion of a contiguous core layer, when viewed in a plan view. The region removed from the core layer may correspond to a mounting region 110, in which the first semiconductor chip 200 is placed. The core portion C with a single opening (or recess) is exemplarily illustrated, but the inventive concept is not limited to this example. In another embodiment, the core portion C may include two or more openings or recesses. In other words, the interconnection substrate CS may include a plurality of openings or recesses, which are spaced apart from each other when viewed in a plan view. Further, plural discrete core portions C may be formed in the semiconductor device. The core portion C may be an insulating material. For example, the core portion C may be formed of or include at least one of glass fibers, a ceramic plate, epoxy materials, or resins. Alternatively, the core portion C may be formed of or include at least one of stainless steel, aluminum (Al), nickel (Ni), magnesium (Mg), zinc (Zn), tantalum (Ta), or combination thereof.

A vertical connection terminal 102 may be provided to vertically penetrate the core portion C. The vertical connection terminal 102 may electrically connect the upper buildup portion UB to the lower buildup portion LB.

The first semiconductor chip 200 may be provided in the mounting region 110 of the core portion C. The mounting region 110 may be a region, which is formed by partially removing a contiguous portion of a core layer to form the core portion C. The mounting region 110 may be extend between a top surface 100a and a bottom surface 100b of the core portion C. In other words, the mounting region 110 may defined by a through-hole within the core portion C, which extends from the top surface 100a of the core portion C to the bottom surface 100b of the core portion C. Alternatively, the mounting region 110 may be in the form of a recess of the core portion C, which extends from the top surface 100a of the core portion C partially through the core portion C toward the bottom surface 100b of the core portion C, as shown in FIG. 2. The following description will be given based on the structure of FIG. 1 but is also equally applicable to a mounting region 110 in the form of a recess.

The first semiconductor chip 200 may be spaced apart from a sidewall of the penetration hole (e.g., an inner side surface of the mounting region 110 of the core portion C) by a predetermined distance and may be enclosed by the inner side surface of the mounting region 110 of the core portion C. In other words, when viewed in a plan view, the core portion C may be provided to enclose the first semiconductor chip 200. The first semiconductor chip 200 may be provided in a face-up manner. For example, the first semiconductor chip 200 may be provided to have an active surface 200a that is directed to the top surface 100a. The first semiconductor chip 200 may include first chip pads 202, which are directed to the top surface 100a of the core portion C. The active surface 200a of the first semiconductor chip 200 may be exposed at the top surface 100a of the core portion C, and an inactive surface 200b of the first semiconductor chip 200 may be exposed at the bottom surface 100b of the core portion C. Alternatively, in the case of the structure of FIG. 2, the first semiconductor chip 200 may be mounted on a bottom surface of the mounting region 110 in such a way that the active surface 200a is directed to the top surface 100a. Accordingly, the active surface 200a of the first semiconductor chip 200 may be exposed to the outside of the core portion C near the top surface 100a, and the inactive surface 200b of the first semiconductor chip 200 may be in contact with the core portion C. The term "contact," as used in this sense, refers to a direct connection (i.e., touching). In this case, the first semiconductor chip 200 may be attached to the bottom surface of the mounting region 110 using an adhesive agent, an adhesion film, or the like. The following description will be again given based on the structure of FIG. 1. A thickness of the first semiconductor chip 200 may be smaller than a total thickness of the interconnection substrate CS. For example, the thickness of the first semiconductor chip 200 may be equal to or smaller than a thickness of the core portion C. In the case of the structure shown in FIG. 1, the thickness of the first semiconductor chip 200 may be substantially equal to the thickness of the core portion C. In the case of the structure shown in FIG. 2, the thickness of the first semiconductor chip 200 may be smaller than the thickness of the core portion C. Items described as "substantially equal" may be exactly equal or may be equal within acceptable variations that may occur, for example, due to manufacturing processes.

The first semiconductor chip 200 may include an integrated circuit with a radio frequency integrated circuit (RFIC) to generate and/or receive radio frequency signals to be transmitted by or received from the first and second antenna patterns 300 and 400. The first semiconductor chip 200 may be electrically connected to the first and second antenna patterns 300 and 400, and this may make it possible to emit and receive corresponding electromagnetic radio frequency signals (which may be referred to herein as antenna signals) in several directions. In some examples, the first and second antenna patterns 300 and 400 may be configured to operate with the same radio frequency carrier signal. For example, the first and second antenna patterns 300 and 400 may be the same or share the same pattern, such as having the same sized radiating elements and same spacing (or same pitch) between the radiating elements forming the first and second antenna patterns 300 and 400. The radiating elements of the first and second antenna patterns 300 and 400 correspond to patch patterns 302 and 402 in the embodiments described herein (although other antenna types may be implemented) and may not have a direct electrical connection to an external device (e.g., in contrast to the direct electrical connections of substrate pads 146). In an embodiment, the integrated circuit of the first semiconductor chip 200 may include a plurality of electronic devices. For example, the integrated circuit may be configured to include various electronic devices, such as a power management integrated circuit (PMIC), a modem, a transceiver, a power amplifier module (PAM), a frequency filter, or a low noise amplifier (LNA), which are used to operate the radio frequency integrated circuit, in addition to the afore-mentioned radio frequency integrated circuit. The integrated circuit of the first semiconductor chip 200 including the radio frequency integrated circuit and the electronic devices may convert a digital signal (e.g., a baseband signal and so forth), to be transmitted from the outside, to an analog signal (e.g., a high frequency radio frequency signal and so forth) and may provide it to the first and second antenna patterns 300 and 400.

In the mounting region 110, a space between the core portion C and the first semiconductor chip 200 may be filled with an insulating material 104. The insulating material 104 may be formed of or include an insulating polymer.

According to an embodiment of the inventive concept, since the first semiconductor chip 200 is buried in the interconnection substrate CS, it is unnecessary to mount the first semiconductor chip 200 on a surface of the interconnection substrate CS, and thus the semiconductor device may be provided to have a reduced size.

The lower and upper buildup portions LB and UB may cover the bottom and top surfaces 100b and 100a, respectively, of the core portion C. The upper buildup portion UB may be in contact with the top surface 100a of the core portion C and the active surface 200a of the first semiconductor chip 200. The lower buildup portion LB may cover the bottom surface 100b of the core portion C and the inactive surface 200b of the first semiconductor chip 200.

The upper buildup portion UB may include a plurality of upper insulating layers 122 and a plurality of upper interconnection layers 124, which are sequentially stacked on the top surface 100a of the core portion C. The upper buildup portion UB may cover the top surface 100a of the core portion C and the active surface 200a of the first semiconductor chip 200. The lower buildup portion LB may include a plurality of lower insulating layers 142 and a plurality of lower interconnection layers 144, which are sequentially stacked on the bottom surface 100b of the core portion C. The lower buildup portion LB may cover the bottom surface 100b of the core portion C and the inactive surface 200b of the first semiconductor chip 200. Each of the upper and lower insulating layers 122 and 142 may be formed of or include at least one of prepreg, an Ajinomoto build-up (ABF) film, FR-4, or bismaleimide triazine (BT). Each of the upper and lower interconnection layers 124 and 144 may include at least one circuit pattern. The upper interconnection layer 124 may be used as a connection pattern electrically connecting the first semiconductor chip 200 to the first antenna pattern 300. The lower interconnection layer 144 may be electrically connected to the upper interconnection layer 124 through the vertical connection terminal 102 and may be used as a connection pattern electrically connecting the first semiconductor chip 200 to the second antenna pattern 400. Each of the upper and lower interconnection layers 124 and 144 may be formed of or include at least one of copper (Cu), aluminum (Al), silver (Ag), tin (Sn), gold (Au), nickel (Ni), lead (Pb), titanium (Ti), or combinations thereof.

The first antenna pattern 300 may be disposed on the upper buildup portion UB. The first antenna pattern 300 may be a planar antenna array, which is composed of a plurality of first patch patterns 302 (e.g., patch antennas) disposed on a top surface UBa of the upper buildup portion UB. The first patch patterns 302 may be disposed throughout the top surface UBa of the upper buildup portion UB, and thus, the first antenna pattern 300 may be overlapped with the first semiconductor chip 200 in a third direction D3. Each of the first patch patterns 302 of the first antenna pattern 300 may be a patch antenna. For example, the first patch patterns 302 may be arranged on the top surface UBa of the upper buildup portion UB and may be used to form a broadside radiation. The first patch patterns 302 may be periodically arranged in a first direction D1 and a second direction D2, as shown in FIG. 3. Each of the first patch patterns 302 may be a plate-shaped structure whose width is much larger than its thickness. The first antenna pattern 300 may be configured to receive electrical signals from the first semiconductor chip 200 and to emit an antenna signal in upward or lateral directions of the upper buildup portion UB. Depending on the structure and position of the first antenna pattern 300, the antenna signal of the semiconductor device may have an omni-directional irradiation property. For example, the first antenna pattern 300 may be provided throughout the top surface UBa of the upper buildup portion UB, and in this case, the antenna signal may have a wide radiation region and a large radiation angle. The first antenna pattern 300 may be formed of or include at least one of conductive materials (e.g., copper (Cu), aluminum (Al), silver (Ag), tin (Sn), gold (Au), nickel (Ni), lead (Pb), titanium (Ti), or alloys thereof), but the inventive concept is not limited to these examples.

According to an embodiment of the inventive concept, since the first semiconductor chip 200 is buried in the core portion C of the interconnection substrate CS and is connected to the first antenna pattern 300 through only the upper buildup portion UB of the interconnection substrate CS, a length of an electric connection path between the first semiconductor chip 200 and the first antenna pattern 300 may be reduced. Accordingly, the electric characteristics of the semiconductor device may be improved.

Outer terminals 500 may be disposed below the lower buildup portion LB. The outer terminals 500 may be provided on a first region R1 of a bottom surface LBa of the lower buildup portion LB. For example, the outer terminals 500 may be disposed on substrate pads 146, which are provided on the first region R1 of the bottom surface LBa of the lower buildup portion LB. Here, the substrate pad 146 may be a portion of the lower interconnection layer 144, which is exposed from the lower insulating layer 142 of the lower buildup portion LB, or an additional pad, which is provided on the lower insulating layer 142 of the lower buildup portion LB and is connected to the lower interconnection layer 144. The outer terminals 500 may be electrically connected to the first semiconductor chip 200 through the lower interconnection layer 144, the vertical connection terminal 102, and the upper interconnection layer 124. The outer terminals 500 may include solder balls, solder bumps, or the like.

The second antenna pattern 400 may be disposed below the lower buildup portion LB. The second antenna pattern 400 may be provided on a second region R2 of the bottom surface LBa of the lower buildup portion LB. The first and second regions R1 and R2 may be arranged in the first direction D1. Thus, the second antenna pattern 400 may be spaced apart from the outer terminals 500 in the first direction D1. An area of the second region R2 may be 0.5 to 2.0 times an area of the first region R1. The second antenna pattern 400 may be a planar antenna array, which is composed of a plurality of second patch patterns 402 disposed on the bottom surface LBa of the lower buildup portion LB. Each of the second patch patterns 402 of the second antenna pattern 400 may be a patch antenna. For example, the second patch patterns 402 may be arranged on the bottom surface LBa of the lower buildup portion LB and may be used to form a broadside radiation. The second patch patterns 402 may be periodically arranged in the first and second directions D1 and D2, as shown in FIG. 4. Each of the second patch patterns 402 may be a plate-shaped structure whose width is much larger than its thickness. The second antenna pattern 400 may be configured to receive electrical signals from the first semiconductor chip 200 and to emit the antenna signal in downward or lateral directions of the lower buildup portion LB. The second antenna pattern 400 may be electrically connected to the first semiconductor chip 200 through the lower interconnection layer 144, the vertical connection terminal 102, and the upper interconnection layer 124. The first semiconductor chip 200 may be configured to apply the electrical signals to the first and second antenna patterns 300 and 400 simultaneously or separately. Depending on the structure and position of the second antenna pattern 400, the antenna signal of the semiconductor device may have an omni-directional irradiation property. The second antenna pattern 400 may be formed of or include at least one of conductive materials (e.g., copper (Cu), aluminum (Al), silver (Ag), tin (Sn), gold (Au), nickel (Ni), lead (Pb), titanium (Ti), or alloys thereof), but the inventive concept is not limited to these examples.

According to an embodiment of the inventive concept, the first semiconductor chip 200 may be buried in the core portion C of the interconnection substrate CS, the second antenna pattern 400 may be provided on the entire region below the interconnection substrate CS, other than the first region R1 provided with the outer terminals 500, and the antenna signal may have a wide radiation region and a large radiation angle, in a downward direction of the semiconductor device. Accordingly, in the downward direction of the semiconductor device, a shadow region of the antenna signal may be reduced and the signal radiation efficiency may be increased.

The semiconductor device may further include a third antenna pattern 600. The third antenna pattern 600 may be disposed on a side surface 100c of the core portion C. The third antenna pattern 600 may include a Yagi antenna. The third antenna pattern 600 may be electrically connected to the first semiconductor chip 200 through the upper or lower buildup portion UB or LB. The third antenna pattern 600 may be configured to receive electrical signals from the first semiconductor chip 200 and to emit the antenna signal in a lateral direction of the core portion C. The third antenna pattern 600 may emit the antenna signal into the shadow region, which is formed between the radiation regions of the first and second antenna patterns 300 and 400, and thus, it may be possible to reduce the shadow region of the antenna signal. In an embodiment, the third antenna pattern 600 may not be provided.

The semiconductor device may be mounted on an external substrate 1000 with the outer terminals 500 interposed therebetween. The first semiconductor chip 200 of the semiconductor device may be electrically connected to the external substrate 1000 through the outer terminals 500. In an embodiment, the external substrate 1000 may be a motherboard or a mainboard of an external electronic product or may be a body, in which the semiconductor device is directly contained. But the inventive concept is not limited to this example, and the external substrate 1000 may mean one of various electronic products, which the semiconductor device can be contained in, mounted on, or coupled to.

The semiconductor device may be mounted on the external substrate 1000 in a flip-chip manner. For example, the outer terminals 500 may connect external substrate pads 1002 of the external substrate 1000 to the substrate pads 146, between the external substrate 1000 and the lower buildup portion LB. Since the first semiconductor chip 200 is not mounted under the lower buildup portion LB and is buried in the core portion C, it may be possible to reduce a gap between the external substrate 1000 and the lower buildup portion LB. Thus, it may be possible to reduce a size of the semiconductor device. A distance between the external substrate 1000 and the lower buildup portion LB may be ¼ to ½ times a wavelength of an electromagnetic wave emitted from the second antenna pattern 400.

Figure 5:
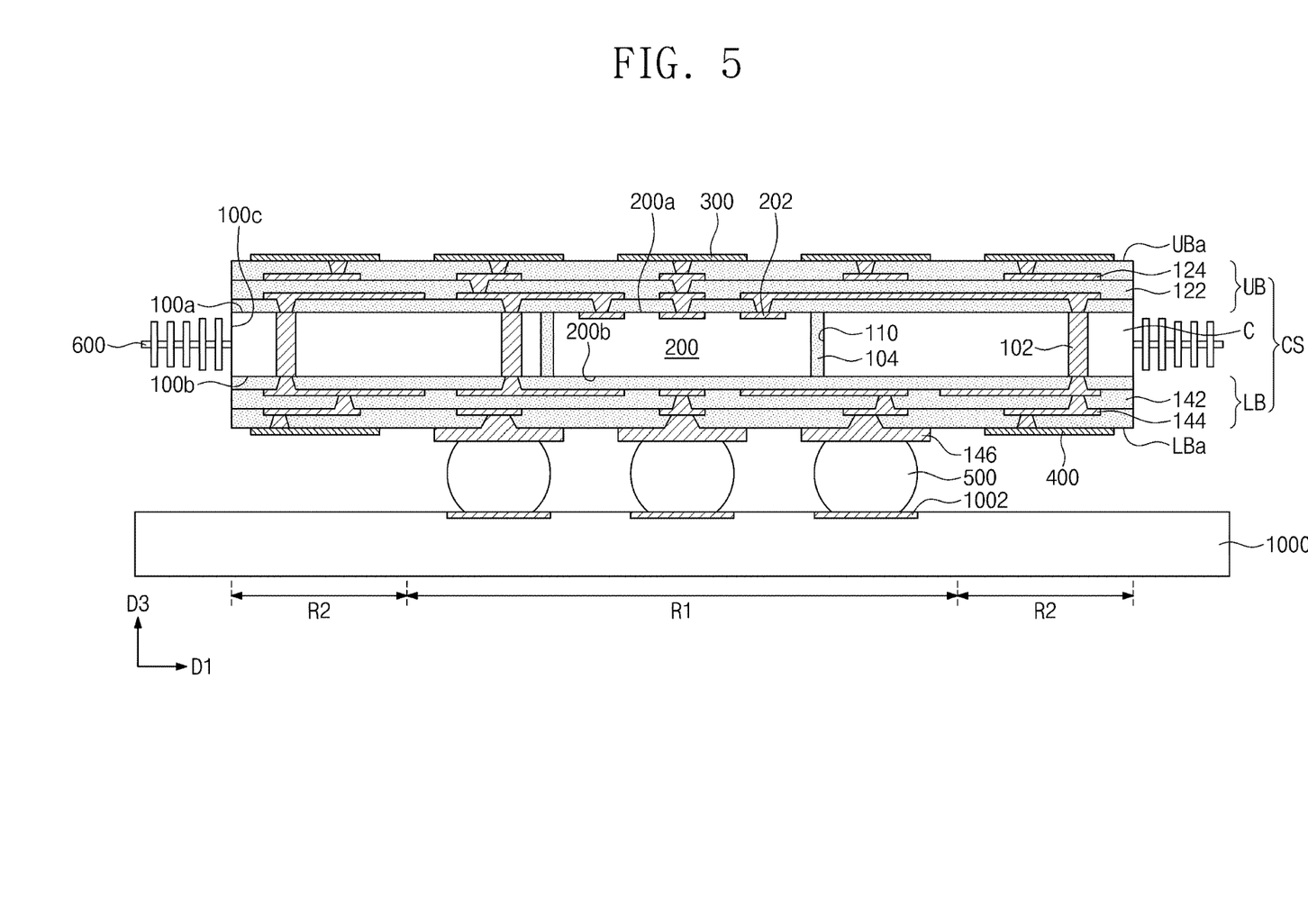
FIG. 5 is a sectional view illustrating a semiconductor device according to an embodiment of the inventive concept.
Figure 6:
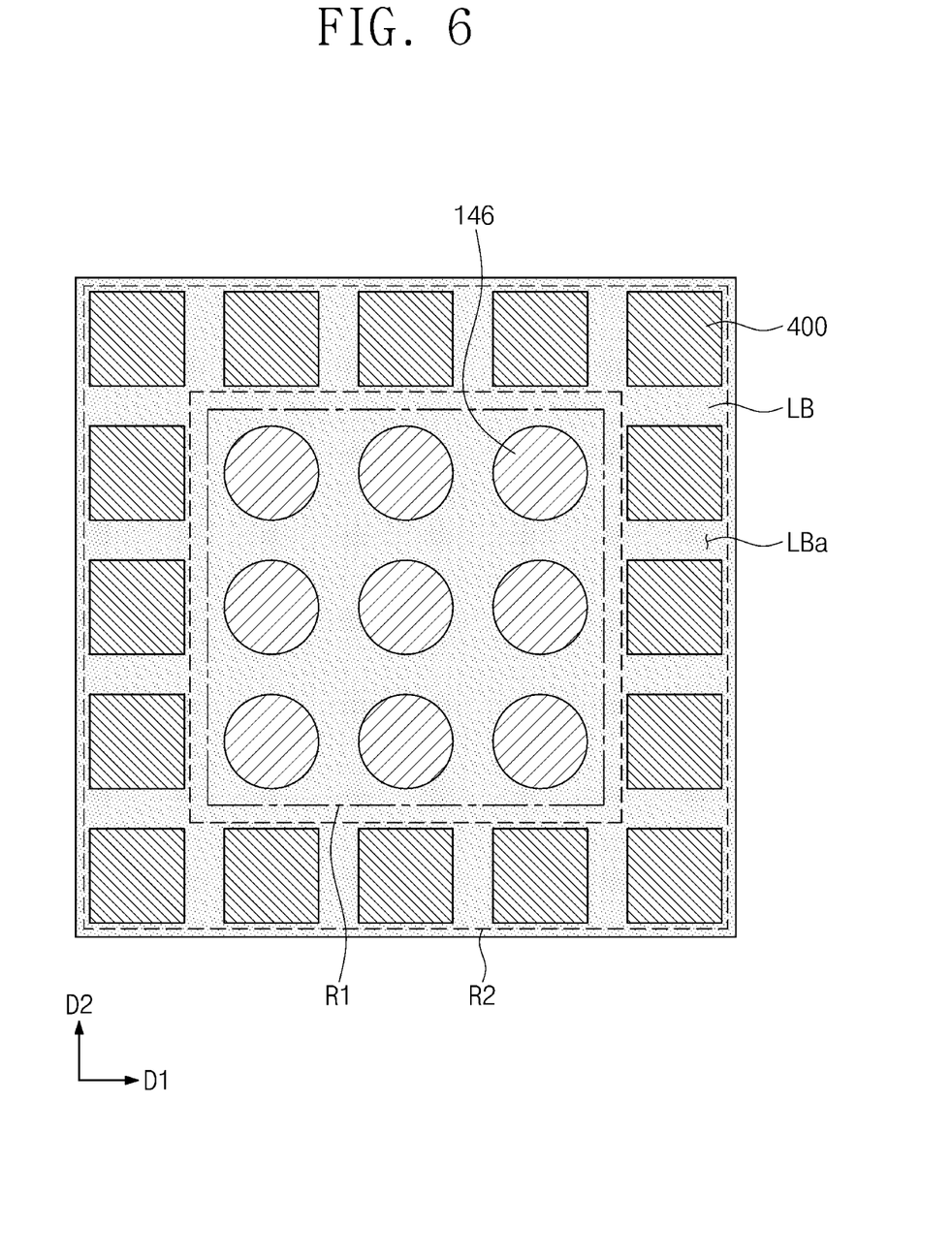
FIG. 6 is a plan view illustrating a semiconductor device according to an embodiment of the inventive concept.

FIG. 5 is a sectional view illustrating a semiconductor device according to an embodiment of the inventive concept. FIG. 6 is a plan view illustrating a semiconductor device according to an embodiment of the inventive concept. The following description will focus on regions provided with the outer terminals and the second antenna pattern. For concise description, a previously described element may be identified by the same reference number without repeating an overlapping description thereof.

FIGS. 1 to 4 illustrate an example, in which the first region R1 and the second region R2 are arranged in the first direction D1, but the inventive concept is not limited to this example.

Referring to FIGS. 5 and 6, the first region R1 may be located at a center portion of the bottom surface LBa of the lower buildup portion LB. The outer terminals 500 may be disposed below the lower buildup portion LB. The outer terminals 500 may be provided on the first region R1 of the bottom surface LBa of the lower buildup portion LB. For example, the outer terminals 500 may be disposed on the substrate pads 146, which are provided on the first region R1 of the bottom surface LBa of the lower buildup portion LB.

The semiconductor device may be mounted on the external substrate 1000 with the outer terminals 500 interposed therebetween. The first semiconductor chip 200 of the semiconductor device may be electrically connected to the external substrate 1000 through the outer terminals 500. Since the outer terminals 500 are provided on the first region R1 located at the center portion of the lower buildup portion LB, the outer terminals 500 may more stably support a center of gravity of the semiconductor device, and thus, the structural stability of the semiconductor device may be improved.

The second region R2 may be located at an outer region of the bottom surface LBa of the lower buildup portion LB. For example, the second region R2 may enclose the first region R1, when viewed in a plan view. The second antenna pattern 400 may be disposed below the lower buildup portion LB. The second antenna pattern 400 may be provided on the second region R2 of the bottom surface LBa of the lower buildup portion LB. The second antenna pattern 400 may be a planar antenna array, which is composed of a plurality of second patch patterns 402 disposed on the bottom surface LBa of the lower buildup portion LB. Each of the second patch patterns 402 of the second antenna pattern 400 may be a patch antenna. The second antenna pattern 400 may be configured to receive electrical signals from the first semiconductor chip 200 and to emit the antenna signal in downward or lateral directions of the lower buildup portion LB. Since the second antenna pattern 400 is provided on the first region R1 located at the outer region of the lower buildup portion LB, it may be possible to improve the radiation efficiency of the antenna signal, which is emitted in a lateral direction of the lower buildup portion LB, and to reduce the shadow region of the antenna signal, in a downward direction of the semiconductor device.

Figure 7:
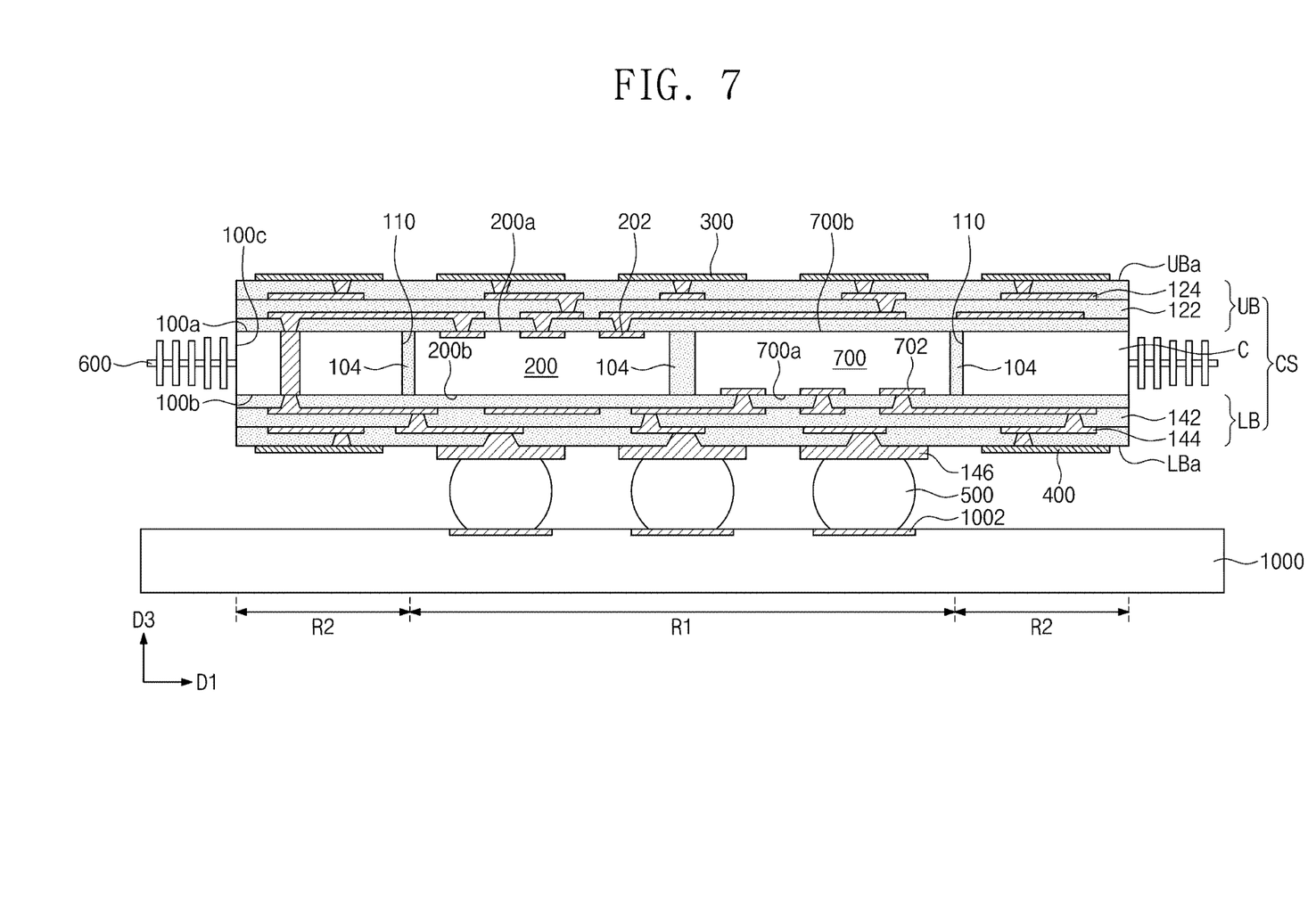
FIGS. 7 to 10 are sectional views, each of which illustrates a semiconductor device according to an embodiment of the inventive concept.
Figure 8:
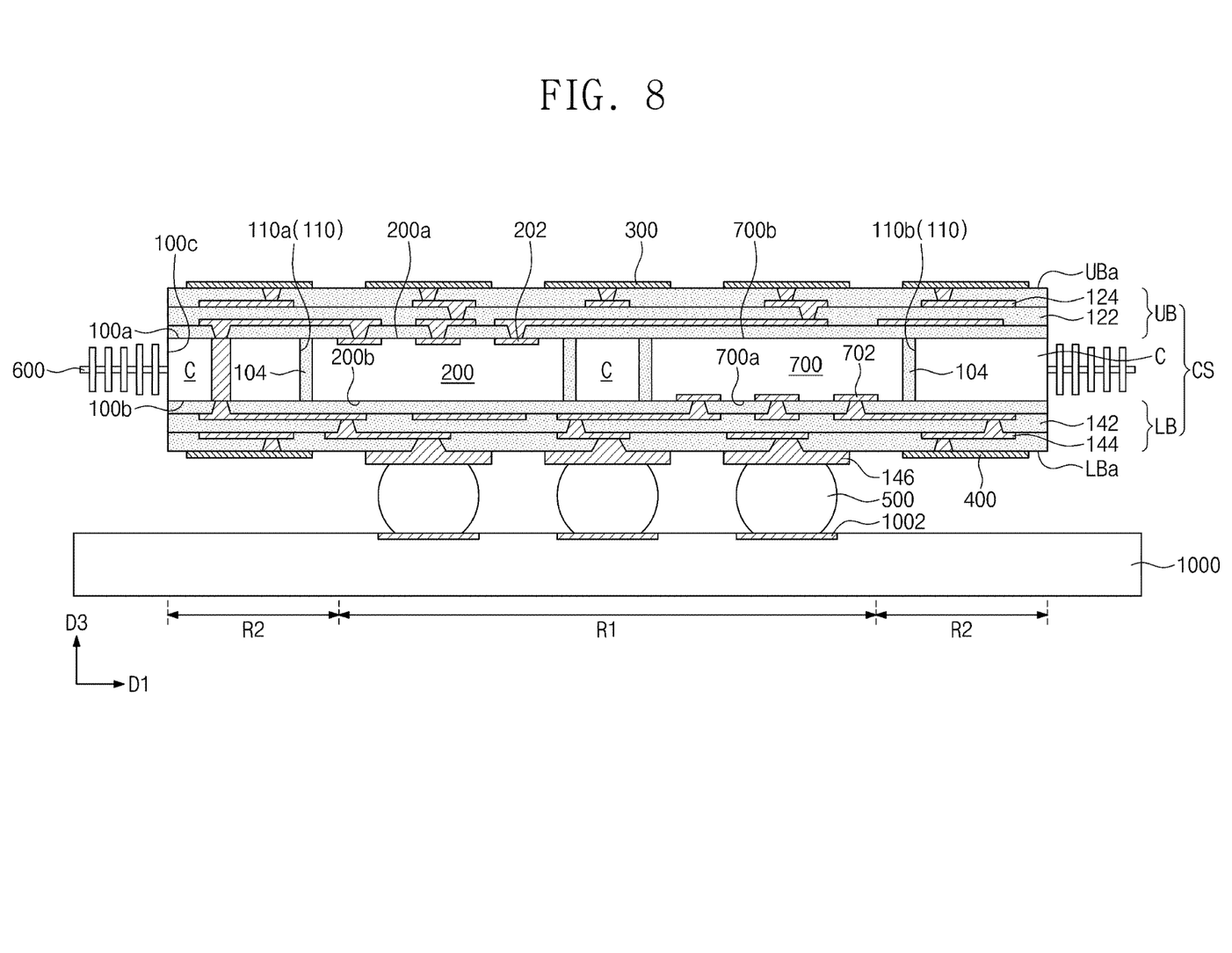

FIGS. 7 and 8 are sectional views illustrating a semiconductor device according to an embodiment of the inventive concept.

FIGS. 1 to 4 illustrate an example, in which one first semiconductor chip is provided, but the inventive concept is not limited to this example.

Referring to FIG. 7, not only the first semiconductor chip 200 but also a second semiconductor chip 700 may be provided in the mounting region 110 of the core portion C. The first and second semiconductor chips 200 and 700 may be spaced apart from the inner side surface of the mounting region 110 by a predetermined distance and may be enclosed by the inner side surface of the mounting region 110. In other words, when viewed in a plan view, the core portion C may be provided to enclose both of the first and second semiconductor chips 200 and 700. The first and second semiconductor chips 200 and 700 may be spaced apart from each other, in the mounting region 110. In an embodiment, the first semiconductor chip 200 may be provided in a face-up manner, and the second semiconductor chip 700 may be provided in a face-down manner. For example, the first semiconductor chip 200 may be disposed to have the active surface 200a directed to the top surface 100a, and the second semiconductor chip 700 may be disposed to have an active surface 700a that is directed to the bottom surface 100b. The first semiconductor chip 200 may include the first chip pads 202, which are provided at a level near the top surface 100a of the core portion C, and the second semiconductor chip 700 may include second chip pads 702, which are provided at a level near the bottom surface 100b of the core portion C. The active surface 200a of the first semiconductor chip 200 may be exposed to the outside of the core portion C near the top surface 100a, and the active surface 700a of the second semiconductor chip 700 may be exposed to the outside of the core portion C near the bottom surface 100b.

Each of the first and second semiconductor chips 200 and 700 may include an integrated circuit with a radio frequency integrated circuit (RFIC). Since the first semiconductor chip 200 is electrically connected to the first antenna pattern 300 and the second semiconductor chip 700 is electrically connected to the second antenna pattern 400, it may be possible to emit the antenna signal in various directions. In an embodiment, the integrated circuit of each of the first and second semiconductor chips 200 and 700 may include a plurality of electronic devices. For example, the integrated circuit may be configured to include various electronic devices, such as a power management integrated circuit (PMIC), a modem, a transceiver, a power amplifier module (PAM), a frequency filter, or a low noise amplifier (LNA), which are used to operate the radio frequency integrated circuit, in addition to the afore-mentioned radio frequency integrated circuit.

In the mounting region 110, a space between the core portion C and the first semiconductor chip 200, a space between the core portion C and the second semiconductor chip 700, and a space between the first and second semiconductor chips 200 and 700 may be filled with the insulating material 104.

The lower and upper buildup portions LB and UB may cover the bottom and top surfaces 100b and 100a, respectively, of the core portion C. The upper buildup portion UB may be in contact with the top surface 100a of the core portion C, the active surface 200a of the first semiconductor chip 200, and an inactive surface 700b of the second semiconductor chip 700. The lower buildup portion LB may cover the bottom surface 100b of the core portion C, the inactive surface 200b of the first semiconductor chip 200, and the active surface 700a of the second semiconductor chip 700.

The upper buildup portion UB may include the upper insulating layers 122 and the upper interconnection layers 124, which are sequentially stacked on the top surface 100a of the core portion C. The upper interconnection layer 124 may be used as a connection pattern electrically connecting the first semiconductor chip 200 to the first antenna pattern 300. Since the first semiconductor chip 200 is buried in the core portion C of the interconnection substrate CS and is connected to the first antenna pattern 300 through only the upper buildup portion UB of the interconnection substrate CS, a length of an electric connection path between the first semiconductor chip 200 and the first antenna pattern 300 may be reduced. This may make it possible to improve the electric characteristics of the semiconductor device.

The lower buildup portion LB may include the lower insulating layers 142 and the lower interconnection layers 144, which are sequentially stacked on the bottom surface 100b of the core portion C. The lower interconnection layer 144 may be used as a connection pattern electrically connecting the second semiconductor chip 700 to the second antenna pattern 400. Since the second semiconductor chip 700 is buried in the core portion C of the interconnection substrate CS and is connected to the second antenna pattern 400 through only the lower buildup portion LB of the interconnection substrate CS, a length of an electric connection path between the second semiconductor chip 700 and the second antenna pattern 400 may be reduced. This may make it possible to improve the electric characteristics of the semiconductor device.

In addition, the first semiconductor chip 200 may transmit an electrical signal to the first antenna pattern 300, and the second semiconductor chip 700 may transmit an electrical signal to the second antenna pattern 400. That is, the first and second antenna patterns 300 and 400 may be independently operated, and the antenna signals of the first and second antenna patterns 300 and 400 may be independently adjusted, if necessary.

In certain embodiments, the first and second semiconductor chips 200 and 700 may be provided on different mounting regions, respectively.

Referring to FIG. 8, the core portion C may include a plurality of mounting regions 110. For example, mounting regions 110 may include a first mounting region 110a and a second mounting region 110b, which are spaced apart from each other. In an embodiment, the first and second mounting regions 110a and 110b may be spaced apart from each other in the first direction D1. Each of the first and second mounting regions 110a and 110b may be a region, which is formed by partially removing the core pattern of the core portion C. Each of the first and second mounting regions 110a and 110b may be exposed to the outside near the top and bottom surfaces 100a and 100b of the core portion C. In other words, each of the first and second mounting regions 110a and 110b may be a through-hole-shaped region, which extends from the top surface 100a of the core portion C to the bottom surface 100b of the core portion C. Alternatively, the first mounting region 110a may be a recess-shaped region, which extends from the top surface 100a of the core portion C toward the bottom surface 100b of the core portion C, and the second mounting region 110b may be a recess-shaped region, which extends from the bottom surface 100b of the core portion C toward the top surface 100a of the core portion C.

The first semiconductor chip 200 may be provided in the first mounting region 110a, and the second semiconductor chip 700 may be provided in the second mounting region 110b. The first semiconductor chip 200 may be spaced apart from an inner side surface of the first mounting region 110a by a predetermined distance and may be enclosed by the inner side surface of the first mounting region 110a. The second semiconductor chip 700 may be spaced apart from an inner side surface of the second mounting region 110b by a predetermined distance and may be enclosed by the inner side surface of the second mounting region 110b. The active surface 200a of the first semiconductor chip 200 may be exposed to the outside of the core portion C near the top surface 100a, and the active surface 700a of the second semiconductor chip 700 may be exposed to the outside of the core portion C near the bottom surface 100b.

The lower and upper buildup portions LB and UB may cover the bottom and top surfaces 100b and 100a, respectively, of the core portion C. The upper buildup portion UB may be in contact with the top surface 100a of the core portion C, the active surface 200a of the first semiconductor chip 200, and the inactive surface 700b of the second semiconductor chip 700. The lower buildup portion LB may cover the bottom surface 100b of the core portion C, the inactive surface 200b of the first semiconductor chip 200, and the active surface 700a of the second semiconductor chip 700.

The upper buildup portion UB may include a plurality of upper insulating layers 122 and a plurality of upper interconnection layers 124, which are sequentially stacked on the top surface 100a of the core portion C. The upper interconnection layer 124 may be used as a connection pattern electrically connecting the first semiconductor chip 200 to the first antenna pattern 300. Since the first semiconductor chip 200 is buried in the core portion C of the interconnection substrate CS and is connected to the first antenna pattern 300 through only the upper buildup portion UB of the interconnection substrate CS, a length of an electric connection path between the first semiconductor chip 200 and the first antenna pattern 300 may be reduced.

The lower buildup portion LB may include a plurality of lower insulating layers 142 and a plurality of lower interconnection layers 144, which are sequentially stacked on the bottom surface 100b of the core portion C. The lower interconnection layer 144 may be used as a connection pattern electrically connecting the second semiconductor chip 700 to the second antenna pattern 400. Since the second semiconductor chip 700 is provided in the second mounting region 110b that is provided regardless of the first mounting region 110a for the first semiconductor chip 200, it may be possible to freely dispose the second semiconductor chip 700. Accordingly, it may be possible to form the second semiconductor chip 700 or the second mounting region 110b near the second antenna pattern 400 connected to the second semiconductor chip 700, and this may make it possible to reduce a length of an electric connection path between the second semiconductor chip 700 and the second antenna pattern 400. As a result, the electric characteristics of the semiconductor device may be improved.

Figure 9:
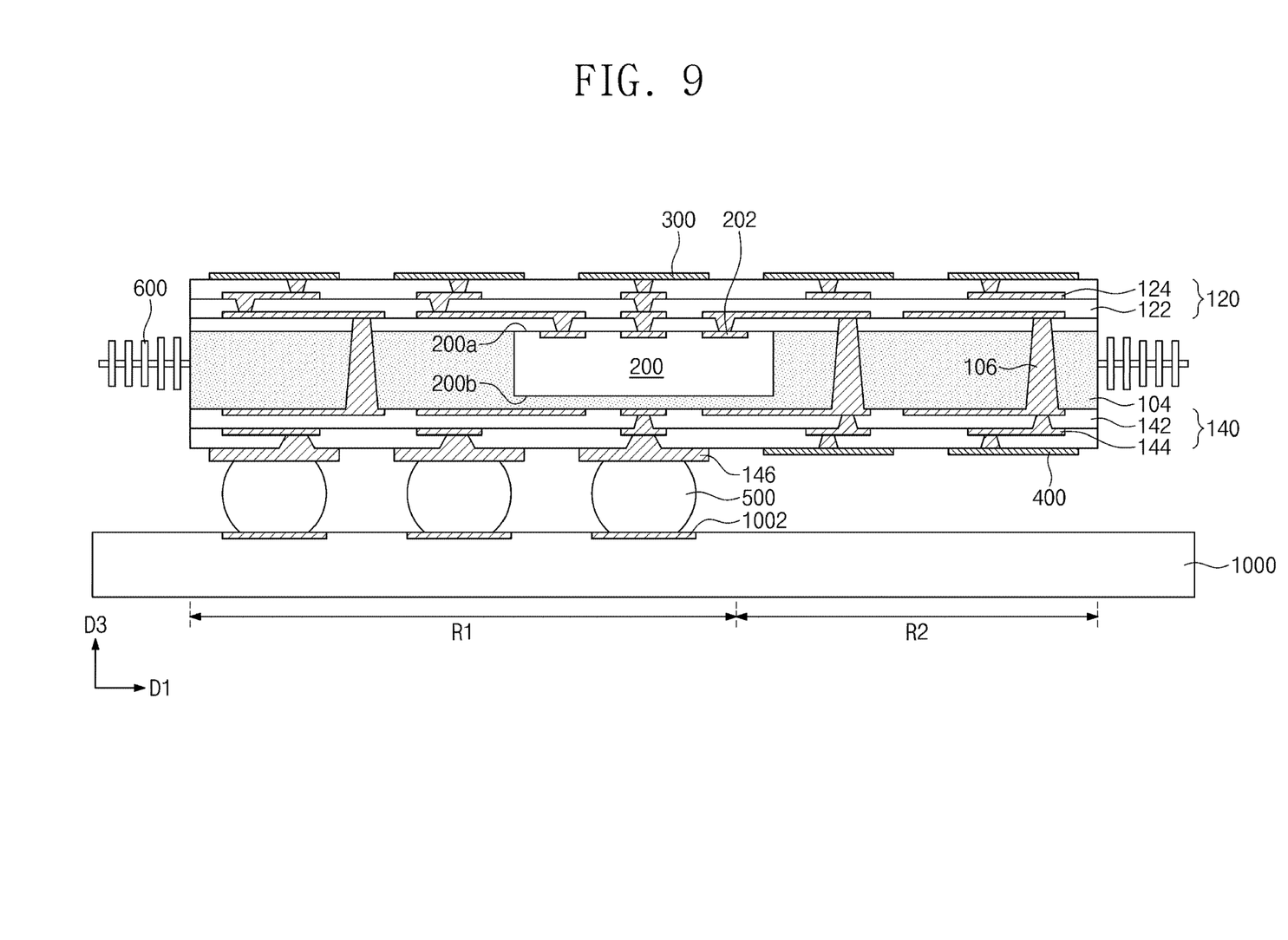

FIG. 9 is a sectional view illustrating a semiconductor device according to an embodiment of the inventive concept.

Referring to FIG. 9, a semiconductor device may include an upper redistribution substrate 120, a semiconductor chip 200, a mold layer 104 as an insulating material, a lower redistribution substrate 140, a first antenna pattern 300, and a second antenna pattern 400.

The upper redistribution substrate 120 may include upper dielectric layers 122 and upper redistribution patterns 124, which are respectively disposed in the upper dielectric layers 122. The upper redistribution substrate 120 may be configured to allow for the redistribution or rerouting of electrical connections to the semiconductor chip 200 via the first chip pads 202 to another component, such as first antenna pattern 300.

Although not shown, an upper protection layer may be disposed on a top surface of the upper redistribution substrate 120. The upper protection layer may cover the upper redistribution substrate 120.

The first antenna pattern 300 may be disposed on the upper redistribution substrate 120 or the upper protection layer. The first antenna pattern 300 may be configured to have substantially the same features as those described with reference to FIGS. 1 and 3. For example, the first antenna patterns 300 may be arrange in a first direction D1 and a second direction D2, on the upper redistribution substrate 120, and may be electrically connected to the semiconductor chip 200 through the upper redistribution substrate 120.

The semiconductor chip 200 may be mounted on the upper redistribution substrate 120. The semiconductor chip 200 may be provided in such a way that an active surface 200a faces the upper redistribution substrate 120. The semiconductor chip 200 may be coupled to the upper redistribution patterns 124 of the upper redistribution substrate 120 through chip pads 202.

The mold layer 104 may be disposed on a surface of the upper redistribution substrate 120. For example, the mold layer 104 may be provided to cover a bottom surface of the upper redistribution substrate 120 and to surround the semiconductor chip 200. The mold layer 104 may cover a side surface and an inactive surface 200b of the semiconductor chip 200. The mold layer 104 may be formed of or include an insulating material (e.g., epoxy molding compound (EMC)).

A via 106 may be disposed in the mold layer 104. The via 106 may be provided near the semiconductor chip 200 to vertically penetrate the mold layer 104. The via 106 may have a width decreasing in a direction toward the upper redistribution substrate 120. The via 106 may penetrate the mold layer 104 and may protrude above a top surface of the mold layer 104. For example, the via 106 may extend into the upper dielectric layer 122 of the upper redistribution substrate 120 and may be coupled to the upper redistribution pattern 124.

Although not shown, a via seed layer may be interposed between the mold layer 104 and the via 106. For example, the via seed layer may be provided to surround a side surface of the via 106.

The lower redistribution substrate 140 may be disposed below the mold layer 104. The lower redistribution substrate 140 may include lower dielectric layers 142, which are provided on the mold layer 104, and lower redistribution patterns 144, which are provided in each of the lower dielectric layers 142.

Although not shown, a lower protection layer may be disposed on a top surface of the lower redistribution substrate 140. The lower protection layer may cover the lower redistribution substrate 140.

Outer terminals 500 may be disposed on the lower redistribution substrate 140 or the lower protection layer. The outer terminals 500 may be provided on a first region R1 of the lower redistribution substrate 140. For example, the outer terminals 500 may be disposed on substrate pads 146, which are provided on the first region R1 of a bottom surface of the lower redistribution substrate 140. The outer terminals 500 may include solder balls, solder bumps, or the like.

The second antenna pattern 400 may be disposed on the lower redistribution substrate 140 or the lower protection layer. The second antenna pattern 400 may be provided on a second region R2 of the bottom surface of the lower redistribution substrate 140. The first and second regions R1 and R2 may be arranged in the first direction D1. Thus, the second antenna pattern 400 may be spaced apart from the outer terminals 500 in the first direction D1. The second antenna pattern 400 may be configured to have substantially the same features as those described with reference to FIGS. 1 and 4. For example, the second antenna patterns 400 may be arranged in the first and second directions D1 and D2, on the lower redistribution substrate 140, and may be electrically connected to the semiconductor chip 200 through the lower redistribution substrate 140, the via 106, and the upper redistribution substrate 120.

The semiconductor device may further include a third antenna pattern 600. The third antenna pattern 600 may be disposed on a side surface of the mold layer 104. The third antenna pattern 600 may include a Yagi antenna. The third antenna pattern 600 may be electrically connected to the semiconductor chip 200 through the upper redistribution substrate 120 or the lower redistribution substrate 140.

Figure 10:
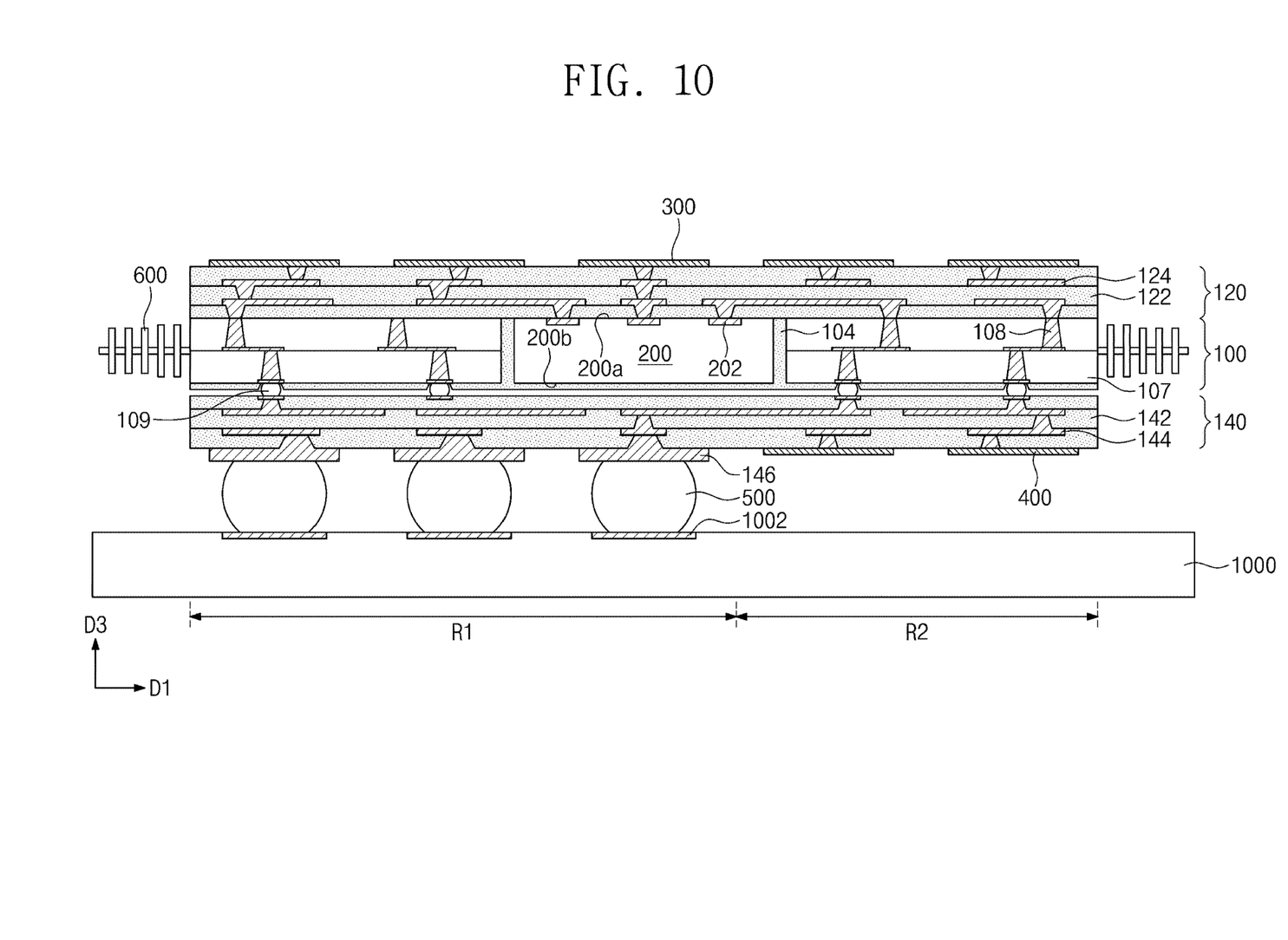

FIG. 10 is a sectional view illustrating a semiconductor device according to an embodiment of the inventive concept.

Referring to FIG. 10, a semiconductor device may include a lower substrate 140, a connection substrate 100, a redistribution substrate 120, a semiconductor chip 200, a first antenna pattern 300, and a second antenna pattern 400.

In an embodiment, the lower substrate 140 may be a printed circuit board (PCB) having a top surface, on which signal patterns are disposed. In another embodiment, the lower substrate 140 may have a structure, in which insulating and interconnection layers are alternately stacked.

Outer terminals 500 may be disposed below the lower substrate 140. The outer terminals 500 may be provided on a first region R1 of the lower substrate 140. For example, the outer terminals 500 may be disposed on substrate pads 146, which are provided on the first region R1 of the bottom surface of the lower substrate 140. The outer terminals 500 may include solder balls, solder bumps, or the like.

The second antenna pattern 400 may be disposed below the lower substrate 140. The second antenna pattern 400 may be provided on a second region R2 of the bottom surface of the lower substrate 140. The first and second regions R1 and R2 may be arranged in a first direction D1. The second antenna pattern 400 may be configured to have substantially the same features as those described with reference to FIGS. 1 and 4. For example, the second antenna patterns 400 may be arranged in the first and second directions D1 and D2, on the lower substrate 140.

The connection substrate 100 may be disposed on the lower substrate 140. The connection substrate 100 may be mounted on a top surface of the lower substrate 140. For example, the connection substrate 100 may be coupled to the lower substrate 140 through a terminal 109, such as a solder bump and a solder ball. The connection substrate 100 may be electrically connected to the outer terminals 500 and the second antenna pattern 400 through the lower substrate 140.

An opening may be provided to penetrate the connection substrate 100 and thereby connect bottom and top surfaces of the connection substrate 100. The connection substrate 100 may include base layers 107 and conductive portions 108 in the base layers 107. As an example, the base layers 107 may be formed of or include silicon oxide. The conductive portion 108 may be disposed outside the connection substrate 100, and the opening may be interposed therebetween. The conductive portion 108 may include connection substrate pads, which are provided on the bottom surface of the connection substrate 100, connection substrate vias, which vertically penetrate the base layers 107, and conductive patterns, which are provided between the base layers 107 and are used for redistribution of electric connection paths.

The semiconductor chip 200 may be disposed on the lower substrate 140. The semiconductor chip 200 may be disposed in the opening of the connection substrate 100. The semiconductor chip 200 may have an area smaller than the opening, when viewed in a plan view. In an embodiment, the semiconductor chip 200 may have an inactive surface 200b facing the lower substrate 140 and an active surface 200a, which is opposite to the inactive surface 200b. For example, the semiconductor chip 200 may include a chip pad 202, which is opposite to the lower substrate 140.

A mold layer 104 may be disposed on a surface of the lower substrate 140. The mold layer 104 may be provided to fill a space between the connection substrate 100 and the semiconductor chip 200. The mold layer 104 may cover the inactive surface 200b of the semiconductor chip 200 and the bottom surface of the connection substrate 100. The mold layer 104 may expose the connection substrate pads of the conductive portion 108, near the bottom surface of the connection substrate 100. The mold layer 104 may be formed of or include at least one of insulating polymers (e.g., Ajinomoto build-up film (ABF) or epoxy-based polymers) or polymeric materials (e.g., thermosetting resins).

The upper redistribution substrate 120 may be provided on the connection substrate 100. The upper redistribution substrate 120 may include upper dielectric layers 122 and upper redistribution patterns 124, which are respectively disposed in the upper dielectric layers 122. The upper redistribution substrate 120 may allow for the redistribution or rerouting of electrical connections to the semiconductor chip 200 via the first chip pads 202 to another component, such as first antenna pattern 300. For example, the upper redistribution patterns 124 may be coupled to the chip pads 202 of the semiconductor chip 200 and the conductive portion 108 of the connection substrate 100. In an embodiment, the semiconductor chip 200 may be mounted on the upper redistribution substrate 120. FIG. 10 illustrates an example, in which the chip pads 202 of the semiconductor chip 200 are in contact with the upper redistribution patterns 124 of the upper redistribution substrate 120, but in an embodiment, terminals, such as solder balls or solder bumps, may be used for the connection of the chip pads 202. Accordingly, the second antenna pattern 400 may be electrically connected to the semiconductor chip 200 through the lower substrate 140, the connection substrate 100, and the upper redistribution substrate 120.

Although not shown, an upper protection layer may be disposed on a top surface of the upper redistribution substrate 120. The upper protection layer may cover the upper redistribution substrate 120.

The first antenna pattern 300 may be disposed on the upper redistribution substrate 120 or the upper protection layer. The first antenna pattern 300 may be configured to have substantially the same features as those described with reference to FIGS. 1 and 3. For example, the first antenna pattern 300 may be arranged in the first and second directions D1 and D2, on the upper redistribution substrate 120, and may be electrically connected to the semiconductor chip 200 through the upper redistribution substrate 120.

Although not shown in FIGS. 9 and 10, in addition to the semiconductor chip 200, a second semiconductor chip may be included between the upper distribution substrate 120 and the lower distribution substrate 140 to thereby provide for a first and a second semiconductor chip included between the upper distribution substrate 120 and the lower distribution substrate 140. The first and second semiconductor chips may be spaced apart from each other. The first semiconductor chip may be provided in a face-up manner, and the second semiconductor chip may be provided in a face-down manner. For example, the first semiconductor chip may be disposed to have an active surface that is in contact with the upper distribution substrate 120, and the second semiconductor chip may be disposed to have an active surface that is in contact with the lower distribution substrate 140. The first semiconductor chip may be coupled to the upper redistribution patterns 124 of the upper redistribution substrate 120 through chip pads included in the first semiconductor chip. The second semiconductor chip may be coupled to the lower redistribution patterns 144 of the lower redistribution substrate 140 through chip pads included in the second semiconductor chip. The first semiconductor chip may be electrically connected to the first antenna pattern 300 and the second semiconductor chip may be electrically connected to the second antenna pattern 400 in a manner similar to the disclosure of FIG. 7.

According to an embodiment of the inventive concept, a semiconductor device may include a semiconductor chip buried in an interconnection substrate, and thus it is unnecessary to mount the semiconductor chip on a surface of the interconnection substrate. Accordingly, it may be possible to reduce a size of the semiconductor device.

In an embodiment, the semiconductor chip may be buried in a core portion of the interconnection substrate and may be connected to a first antenna pattern through only an upper buildup portion of the interconnection substrate. Thus, it may be possible to reduce a length of an electric connection path between the semiconductor chip and the first antenna pattern and thereby to improve electric characteristics of the semiconductor device.

In addition, a second antenna pattern may be provided on the entire region below the interconnection substrate, except for a region provided with connection terminals, and this may allow an antenna signal to have a wide radiation region and a large radiation angle, in a downward direction of the semiconductor device. Accordingly, in the downward direction of the semiconductor device, a shadow region of the antenna signal may be reduced and the signal radiation efficiency may be increased.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a substrate, a bottom surface of the substrate including first and second regions spaced apart from each other;
a first semiconductor chip buried in the substrate, the first semiconductor chip having a first active surface that is directed to a top surface of a core portion of the substrate;
a first antenna pattern provided on the top surface of the substrate and electrically connected to the first semiconductor chip;
a second antenna pattern provided on the first region of the bottom surface of the substrate; and
outer terminals provided on the second region of the bottom surface of the substrate.

2. The semiconductor device of claim 1, wherein the first region encloses the second region, when viewed in a plan view.

3. The semiconductor device of claim 1, wherein the first antenna pattern is vertically overlapped with the first semiconductor chip.

4. The semiconductor device of claim 1, wherein the first antenna pattern is connected to first chip pads, which are provided on the first active surface of the first semiconductor chip, through an upper buildup portion of the substrate, and the second antenna pattern is connected to the first chip pads of the first semiconductor chip through a vertical connection terminal, which extends from a bottom surface of the upper buildup portion of the substrate to a top surface of a lower buildup portion of the substrate.

5. The semiconductor device of claim 4, wherein the upper buildup portion is disposed at a higher level than the first semiconductor chip in a first direction perpendicular to the top surface of the substrate.

6. The semiconductor device of claim 1, further comprising a second semiconductor chip buried in the substrate,
wherein the second semiconductor chip has a second active surface that is directed to a bottom surface of the core portion of the substrate, and
the second antenna pattern is connected to second chip pads, which are provided on the second active surface of the second semiconductor chip, through a lower buildup portion of the substrate.

7. The semiconductor device of claim 6, wherein the lower buildup portion is disposed at a lower level than the first semiconductor chip in a first direction perpendicular to the top surface of the substrate.

8. The semiconductor device of claim 6, wherein the second semiconductor chip is spaced apart from the first semiconductor chip in a second direction parallel to the top surface of the substrate, and
the second region is spaced apart from the first region in the second direction.

9. The semiconductor device of claim 1, wherein an area of the first region is 0.5 to 2.0 times an area of the second region.

10. A semiconductor device, comprising:
a core portion having a first surface and a second surface, which are opposite to each other;
a first buildup portion and a second buildup portion provided on the first surface and the second surface, respectively, each of the first and second buildup portions comprising a plurality of insulating layers and a plurality of interconnection layers, which are sequentially stacked;
a first semiconductor chip, which is provided in a first mounting region formed by partially removing the core portion and is electrically connected to the first buildup portion;
a first antenna pattern provided on a surface of the first buildup portion;
a second antenna pattern provided on a surface of the second buildup portion; and
outer terminals provided on the surface of the second buildup portion,
wherein the second antenna pattern is provided on a first region of the second buildup portion, and
the outer terminals are provided on a second region of the second buildup portion, which is different from the first region.

11. The semiconductor device of claim 10, wherein the first region encloses the second region, when viewed in a plan view.

12. The semiconductor device of claim 10, wherein the outer terminals are coupled to an external substrate, and
a distance between the external substrate and the second buildup portion is ¼ to ½ times a wavelength of an electromagnetic wave emitted from the second antenna pattern.

13. The semiconductor device of claim 10, wherein the first antenna pattern is electrically connected to the first semiconductor chip through the first buildup portion, and
the second antenna pattern is electrically connected to the first semiconductor chip through the second buildup portion, the first buildup portion, and at least one of a vertical connection terminal and a via.

14. The semiconductor device of claim 10, further comprising a second semiconductor chip, which is provided in the first mounting region of the core portion to be spaced apart from the first semiconductor chip, wherein the second semiconductor chip is electrically connected to the second buildup portion.

15. The semiconductor device of claim 14, wherein the first antenna pattern is electrically connected to the first semiconductor chip through the first buildup portion, and the second antenna pattern is electrically connected to the second semiconductor chip through the second buildup portion.

16. The semiconductor device of claim 14, wherein the second semiconductor chip is spaced apart from the first semiconductor chip in a first direction, which is parallel to the first surface of the core portion, and the second region is spaced apart from the first region in the first direction.

17. The semiconductor device of claim 10, further comprising a third semiconductor chip, which is provided in a second mounting region formed by removing another portion of the core portion, wherein the third semiconductor chip is electrically connected to the second buildup portion.

18. A semiconductor device, comprising:

a first redistribution substrate;

a first semiconductor chip having a first active surface in contact with a bottom surface of the first redistribution substrate;

a mold layer disposed on the bottom surface of the first redistribution substrate and covering a bottom surface of the first semiconductor chip;

a second redistribution substrate disposed on the mold layer and below the first semiconductor chip in a direction perpendicular to the bottom surface of the first redistribution substrate;

conductive portions provided at a side of the first semiconductor chip to electrically connect the first and second redistribution substrates to each other;

a first antenna pattern, which is provided on a top surface of the first redistribution substrate and is electrically connected to the first semiconductor chip through the first redistribution substrate;

a second antenna pattern provided on a first region of a bottom surface of the second redistribution substrate; and an outer terminal provided on a second region of the bottom surface of the second redistribution substrate, the first and second regions being spaced apart from each other.

19. The semiconductor device of claim 18, further comprising an insulating layer, which is provided between the first and second redistribution substrates to bury the first semiconductor chip, wherein the vertical connection terminals comprise a via, which extends from a top surface of the first redistribution substrate to a bottom surface of the second redistribution substrate to vertically penetrate the insulating layer.

20. The semiconductor device of claim 18, further comprising a connection substrate, which is disposed between the first and second redistribution substrates and is spaced apart from the first semiconductor chip, wherein the first semiconductor chip is provided in a mounting region formed by partially removing the connection substrate, and the vertical connection terminals comprise a conductive portion buried in base layers of the connection substrate.

* * * * *